United States Patent
Khurana et al.

(10) Patent No.: US 9,583,207 B2
(45) Date of Patent: Feb. 28, 2017

(54) ADAPTIVE DATA SHAPING IN NONVOLATILE MEMORY

(71) Applicant: SanDisk Technologies Inc., Plano, TX (US)

(72) Inventors: Bhuvan Khurana, Milpitas, CA (US); Niles Yang, Mountain View, CA (US); Jianmin Huang, San Carlos, CA (US); Ting Luo, Sunnyvale, CA (US); Idan Alrod, Herzliya (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/618,317

(22) Filed: Feb. 10, 2015

(65) Prior Publication Data

US 2016/0232983 A1    Aug. 11, 2016

(51) Int. Cl.
*G11C 16/34* (2006.01)
*G11C 7/10* (2006.01)
*G11C 11/56* (2006.01)
*G11C 16/10* (2006.01)
*G11C 13/00* (2006.01)

(52) U.S. Cl.
CPC .......... *G11C 16/349* (2013.01); *G11C 7/1006* (2013.01); *G11C 11/56* (2013.01); *G11C 11/5628* (2013.01); *G11C 13/0035* (2013.01); *G11C 13/0069* (2013.01); *G11C 16/10* (2013.01); *G11C 2211/5641* (2013.01); *G11C 2211/5644* (2013.01); *G11C 2211/5647* (2013.01); *G11C 2213/71* (2013.01)

(58) Field of Classification Search
CPC .... G11C 16/349; G11C 16/3495; G11C 16/10
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

*Primary Examiner* — Vanthu Nguyen
(74) *Attorney, Agent, or Firm* — Kunzler Law Group, PC

(57) ABSTRACT

A nonvolatile memory block experiences multiple write-erase cycles during which data is subject to a shaping operation prior to storage. In response to a write-erase cycle count reaching a predetermined number, a polling cycle occurs during which shaping is disabled and data is collected that indicates a condition of the block. Subsequently, shaping is reenabled for subsequent cycles.

22 Claims, 14 Drawing Sheets

(56) References Cited

U.S. PATENT DOCUMENTS

| | | | | |
|---|---|---|---|---|
| 6,292,868 B1* | 9/2001 | Norman | ............... | G11C 16/26 |
| | | | | 365/202 |
| 7,783,846 B2* | 8/2010 | Chainer | ............... | G11C 7/22 |
| | | | | 711/159 |
| 8,737,141 B2* | 5/2014 | Melik-Martirosian | | G11C 16/349 |
| | | | | 365/189.011 |
| 9,164,836 B2* | 10/2015 | Guo | ............... | G06F 11/1068 |
| 2011/0080786 A1* | 4/2011 | Fernandes | ......... | G11C 11/5628 |
| | | | | 365/185.03 |
| 2012/0220088 A1 | 8/2012 | Alsmeier | | |
| 2013/0086312 A1* | 4/2013 | Miura | ............... | G06F 12/0246 |
| | | | | 711/103 |
| 2013/0107628 A1 | 5/2013 | Dong et al. | | |
| 2013/0229846 A1 | 9/2013 | Chien et al. | | |
| 2014/0372814 A1* | 12/2014 | Oberlaender | ...... | G06F 11/1048 |
| | | | | 714/719 |

* cited by examiner

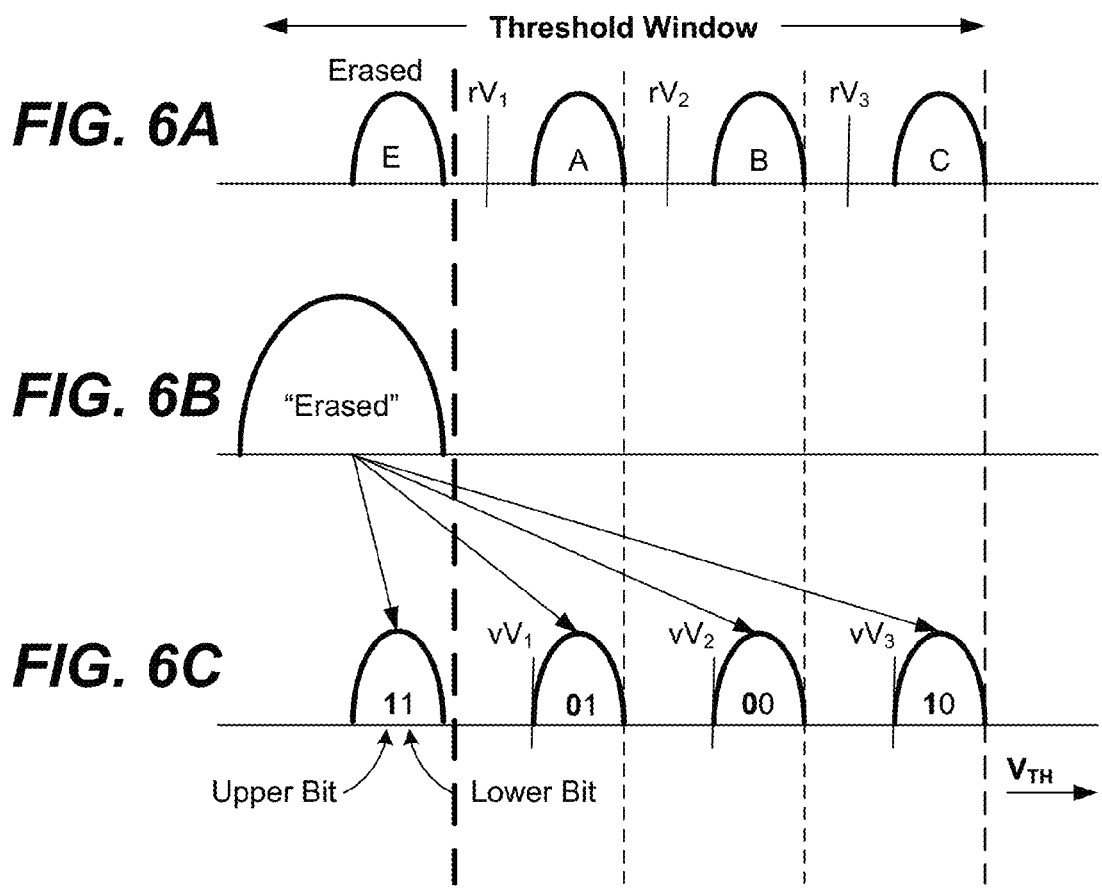
Programming into four states represented by a 2-bit code

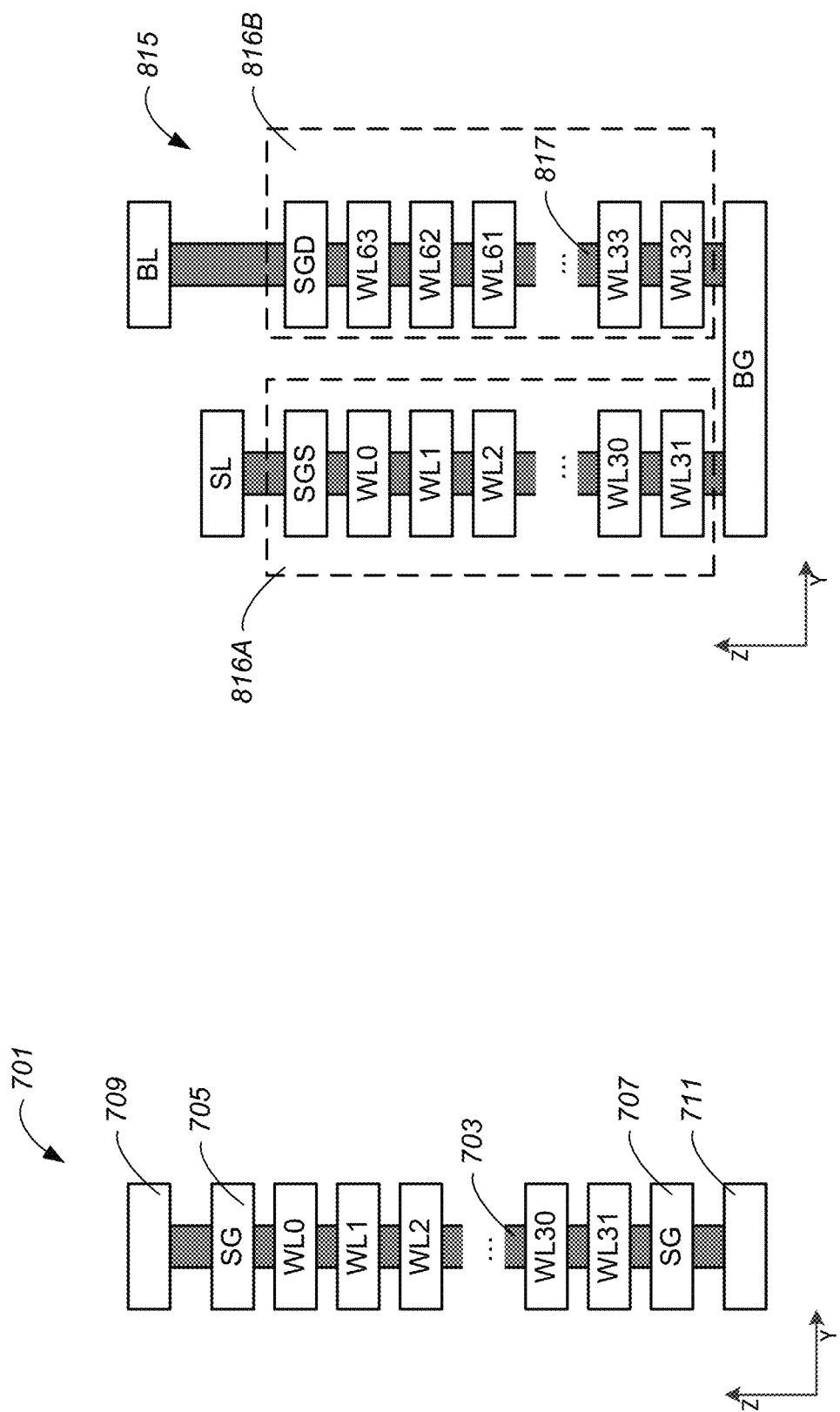

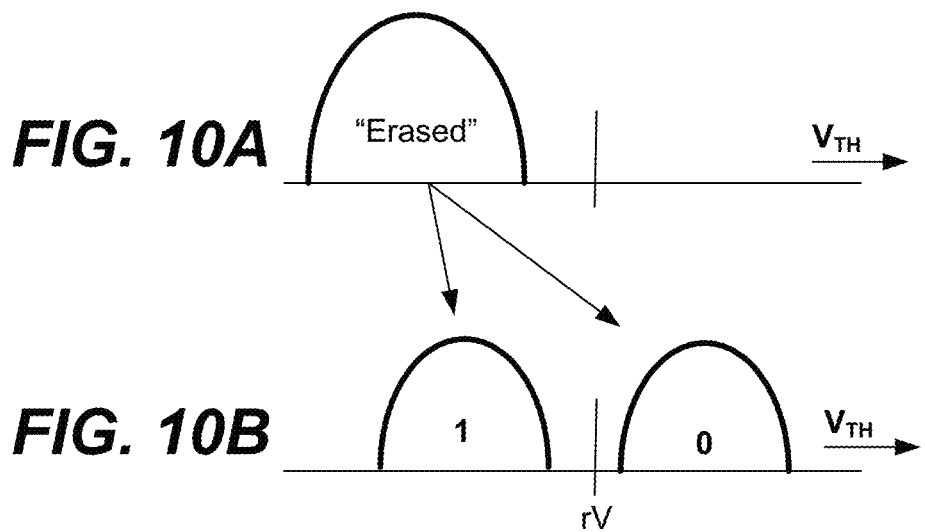
FIG. 10A
FIG. 10B
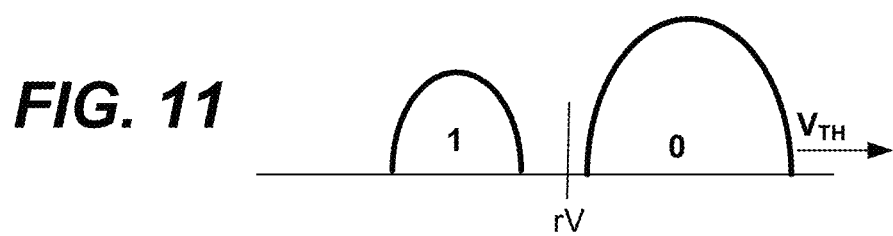
FIG. 11
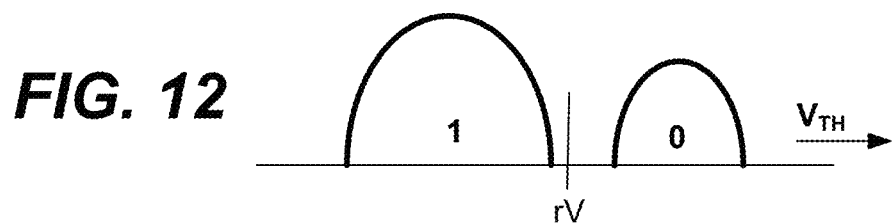
FIG. 12

ADAPTIVE DATA SHAPING IN NONVOLATILE MEMORY

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

SUMMARY

In some memory systems, data may be shaped prior to storage so that the data may be more efficiently stored. For example, data may be transformed to reduce the number of cells programmed to higher threshold voltages and thereby reduce power consumed during programming and to reduce programming time. In some memory systems, portions of a memory array are monitored by periodically collecting data relating to characteristics of individual portions. For example, block health monitoring may monitor health of blocks periodically during a "polling cycle," a write-erase cycle during which data is collected regarding the block's characteristics. Polling cycles may be triggered, for example, by a write-erase cycle count reaching a predetermined number, such as an integer multiple of a polling interval. Data shaping may be disabled during a polling cycle so that characterization data is collected for writing, reading, and erasing of balanced data instead of shaped data. Such characterization data may more accurately represent block health.

An example of a method of operating a nonvolatile memory includes: maintaining a write-erase cycle count for a block in a nonvolatile memory; performing a plurality of write-erase cycles on the block, data written during the plurality of write-erase cycles subject to a shaping operation prior to storage; in response to the write-erase cycle count reaching a predetermined number, initiating a polling cycle; during the polling cycle: (a) disabling the shaping operation so that data is stored without being subject to the shaping operation; (b) collecting data that indicates a condition of the block; and subsequently, after the polling cycle, reenabling the shaping operation for subsequent write-erase cycles.

A shaped-data indicator may be stored with any portion of data that was subject to the shaping operation prior to storage. The shaping operation may include inverting portions of data. The shaping operation may include dividing user data into portions of data of a uniform size and inverting any portion of data containing more than a threshold number of bits of a first logic state. The predetermined number may be an integer multiple of a predetermined interval, and a polling cycle may be initiated, and steps (a) and (b) may be repeated whenever the write-erase cycle count is any integer multiple of the predetermined interval. The data that indicates the condition of the block may include data regarding conditions used to perform a write operation on the block. The data regarding conditions used to perform the write operation may include at least one of: a number of programming pulses applied, a time required for programming, a programming voltage. The data that indicates the condition of the block may include data obtained from a read operation performed during the write-erase cycle. The data from the read operation may include a number of bad bits in data read from the block. The data that indicates the condition of the block may include data regarding erase conditions applied to erase the block. Between polling cycles, data folding operations that use the block as a destination block may be performed by reading portions of data from Single Level Cell (SLC) blocks to an on-chip location that is on a chip on which the SLC blocks are located and storing the portions of data in the block without transferring the portions of data off the chip; and during the polling cycle, data folding operations that use the block as a destination block may be performed by transferring portions of data from SLC blocks to an off-chip location that is not on the chip, reversing any shaping operations that were performed on the portions of data prior to storage in the SLC blocks, and storing resulting unshaped data in the block. Between polling cycles, error rates in the portions of data read from SLC blocks may be identified; and if an error rate exceeds a maximum value then corresponding portions of data read from the SLC blocks may be transferred to the off-chip location that is not on the chip, reversing any shaping operations that were performed on the portions of data prior to storage in the SLC blocks, correcting errors in the portions of data read from the SLC blocks, and storing resulting corrected unshaped data in the block. During the polling cycle, Error Correction Code (ECC) correction of the portions of data may be performed prior to storage in the block. The SLC blocks and the block may be formed in a common plane and the on-chip location may include data latches of the common plane. The off-chip location may be on a memory controller chip.

An example of a method of operating a nonvolatile memory includes: performing a plurality of write-erase cycles on a plurality of blocks, write erase cycles including two types of cycle, a polling cycle and a non-polling cycle; in a non-polling cycle, performing data shaping on data prior to storage in the nonvolatile memory, the data shaping reducing a first number of bits of a first logic state that is mapped to a high threshold voltage range and increasing a second number of bits of a second logic state that is mapped to a low threshold voltage range; in a polling cycle, storing data in the nonvolatile memory without the data shaping; and in the polling cycle, collecting data related to at least one of: programming, reading, and/or erasing the data.

Individual write-erase cycle counts may be maintained for the plurality of blocks. A polling cycle may be initiated in response to a write-erase cycle count for an individual block being equal to an integer multiple of a polling interval and whenever the write-erase cycle count for the individual block is not equal to an integer multiple of the polling interval a non-polling cycle may be initiated. The data collected in the polling cycle may be used to select a set of parameters that may subsequently be used for accessing the block during a plurality of non-polling cycles.

An example of a nonvolatile memory system includes: a plurality of independently erasable blocks; a data shaping circuit that is configured to modify user data received from a host and send the modified user data for storage during a non-polling write-erase cycle, the data shaping circuit configured to send unmodified user data for storage during a polling write-erase cycle; and a block health monitoring circuit that generates a block health indicator for each of the plurality of blocks, the indicator being updated based on data obtained during a polling write-erase cycle.

On-chip data latches may store data during on-chip folding of data from Single Level Cell (SLC) to Multi Level Cell (MLC) blocks during a non-polling write-erase cycle and off-chip storage may store data off-chip during folding of data from SLC to MLC blocks during a polling write-erase cycle. A data deshaping circuit may be configured to deshape shaped data stored in SLC blocks prior to folding during a polling write-erase cycle.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

FIGS. 10A-B show an example of programming memory cells.

FIG. 11 shows an example of memory cells programmed with unbalanced data.

FIG. 12 shows another example of memory cells programmed with unbalanced data.

DETAILED DESCRIPTION

Memory System

Figure 1:
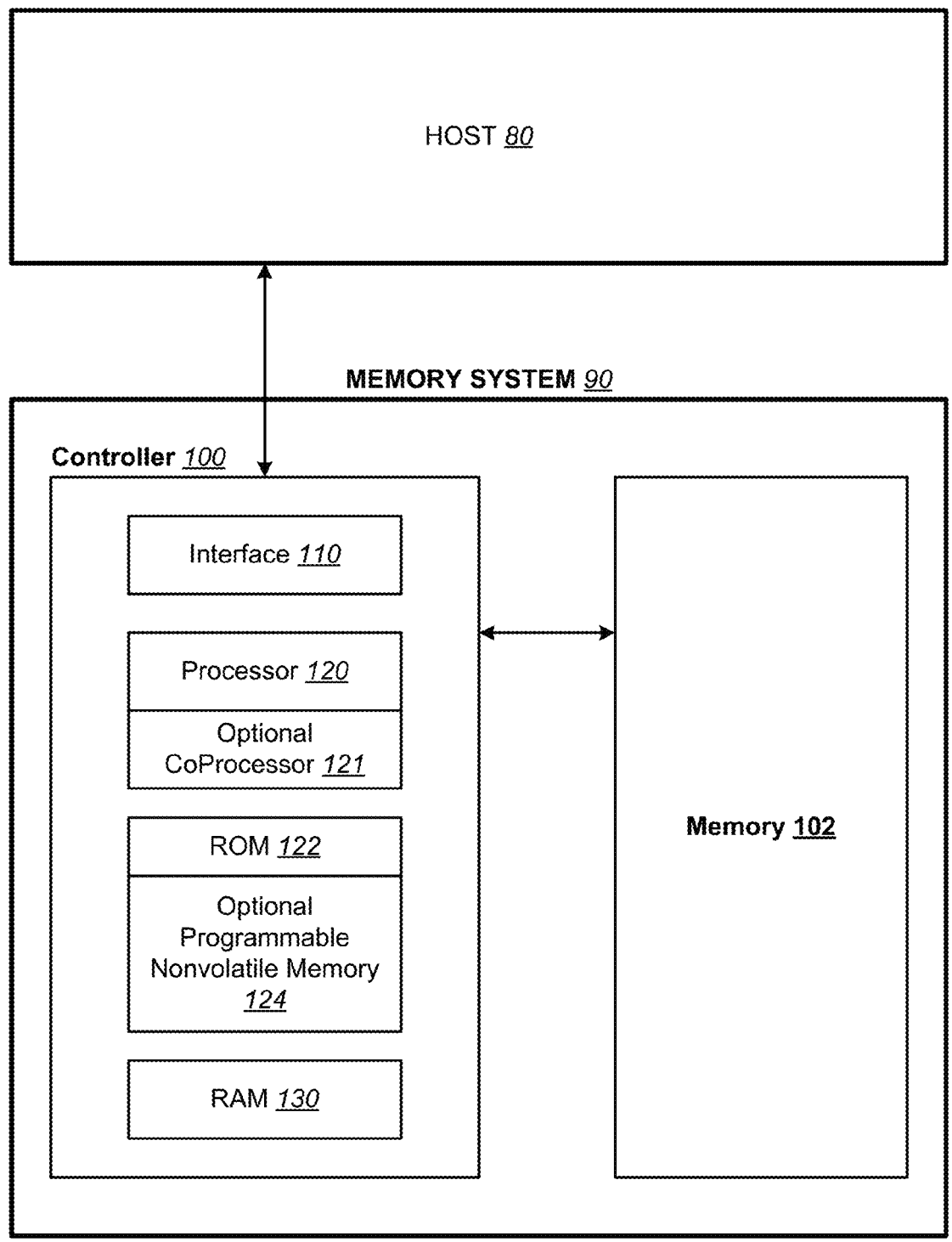
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
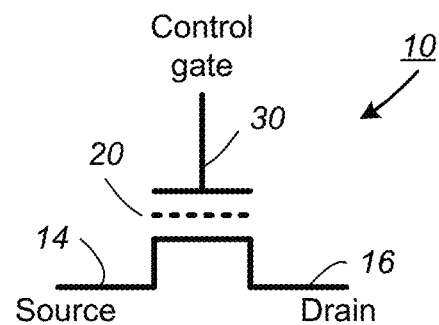
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, for example having one or more charge storage element, resistive element, or other structure.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
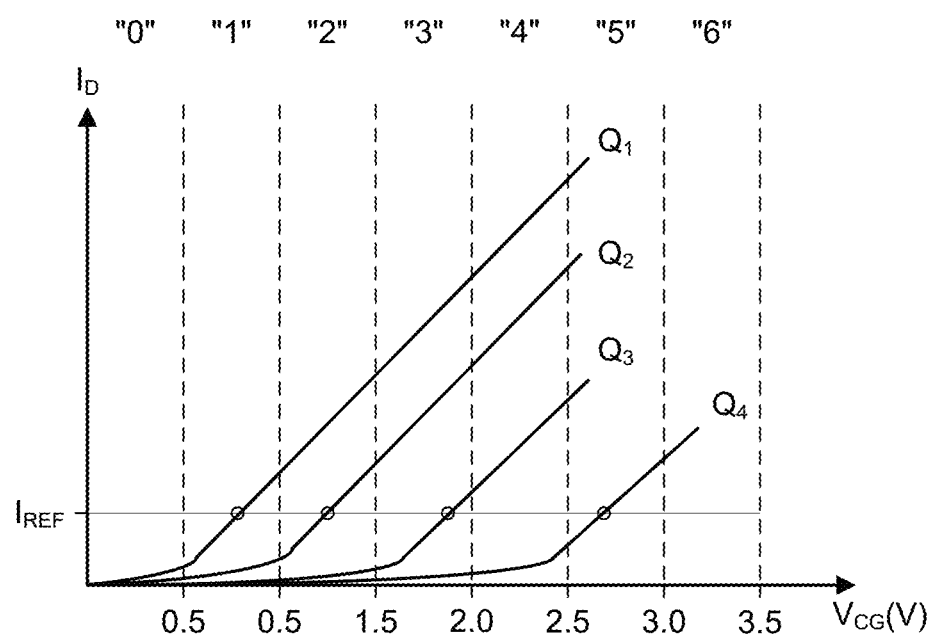
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG 0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
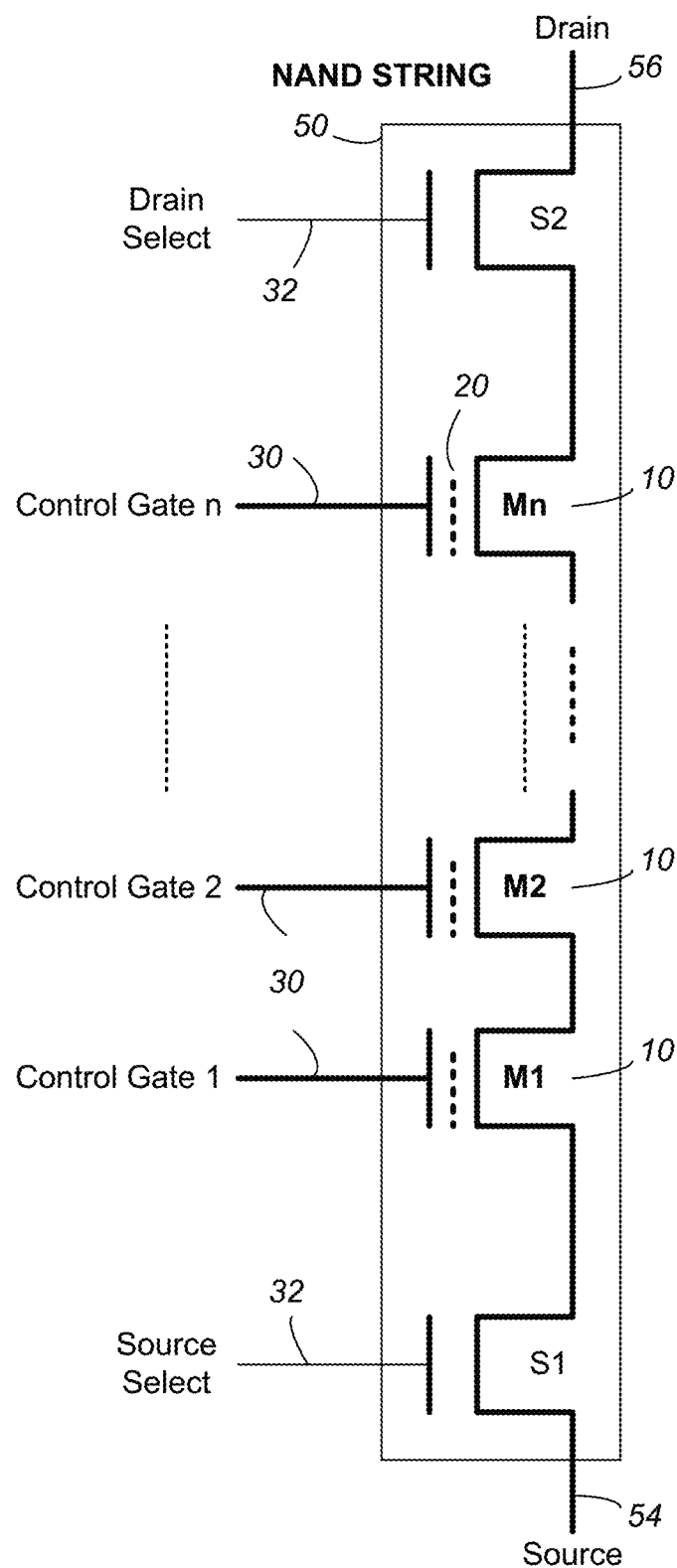
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
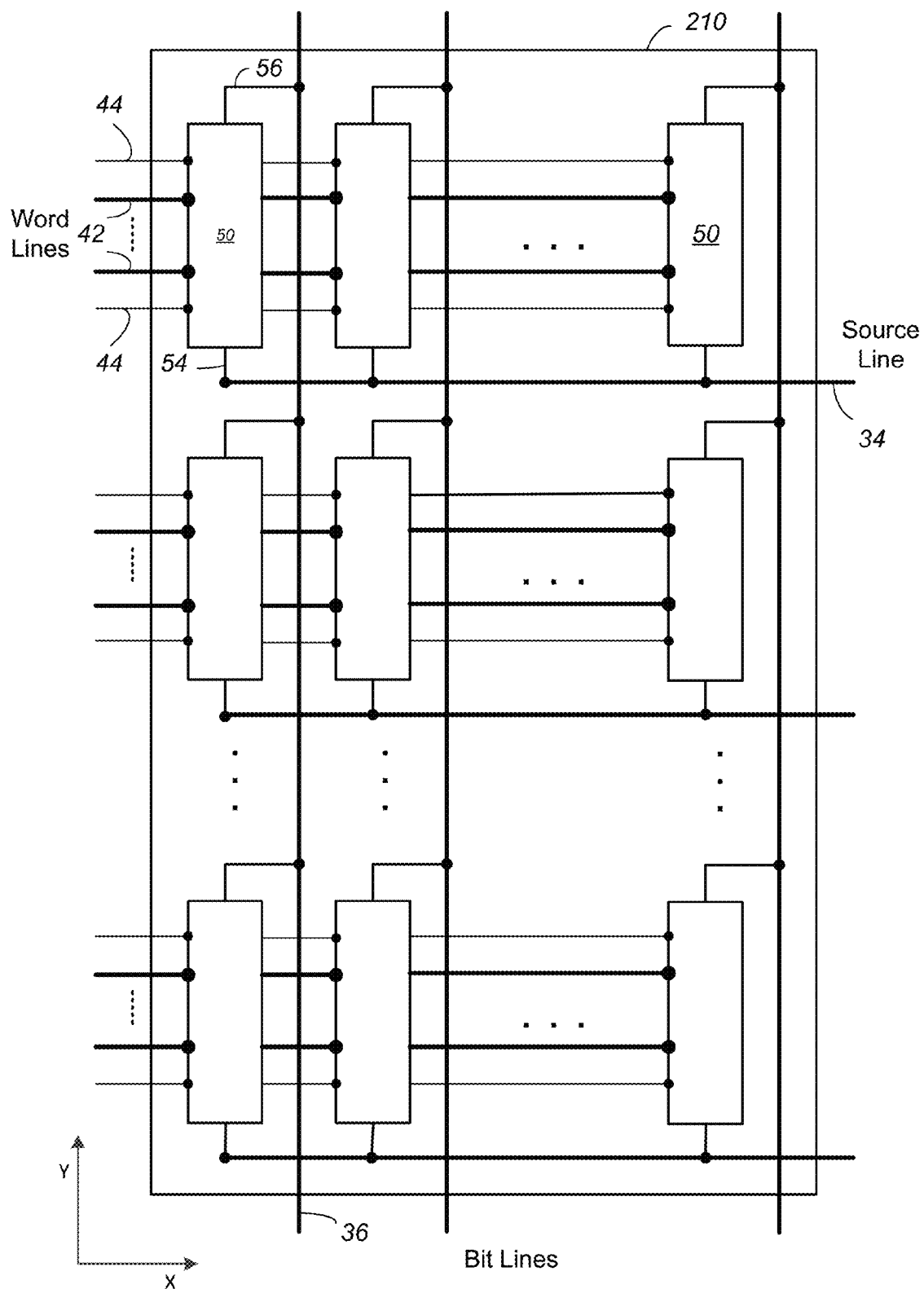
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
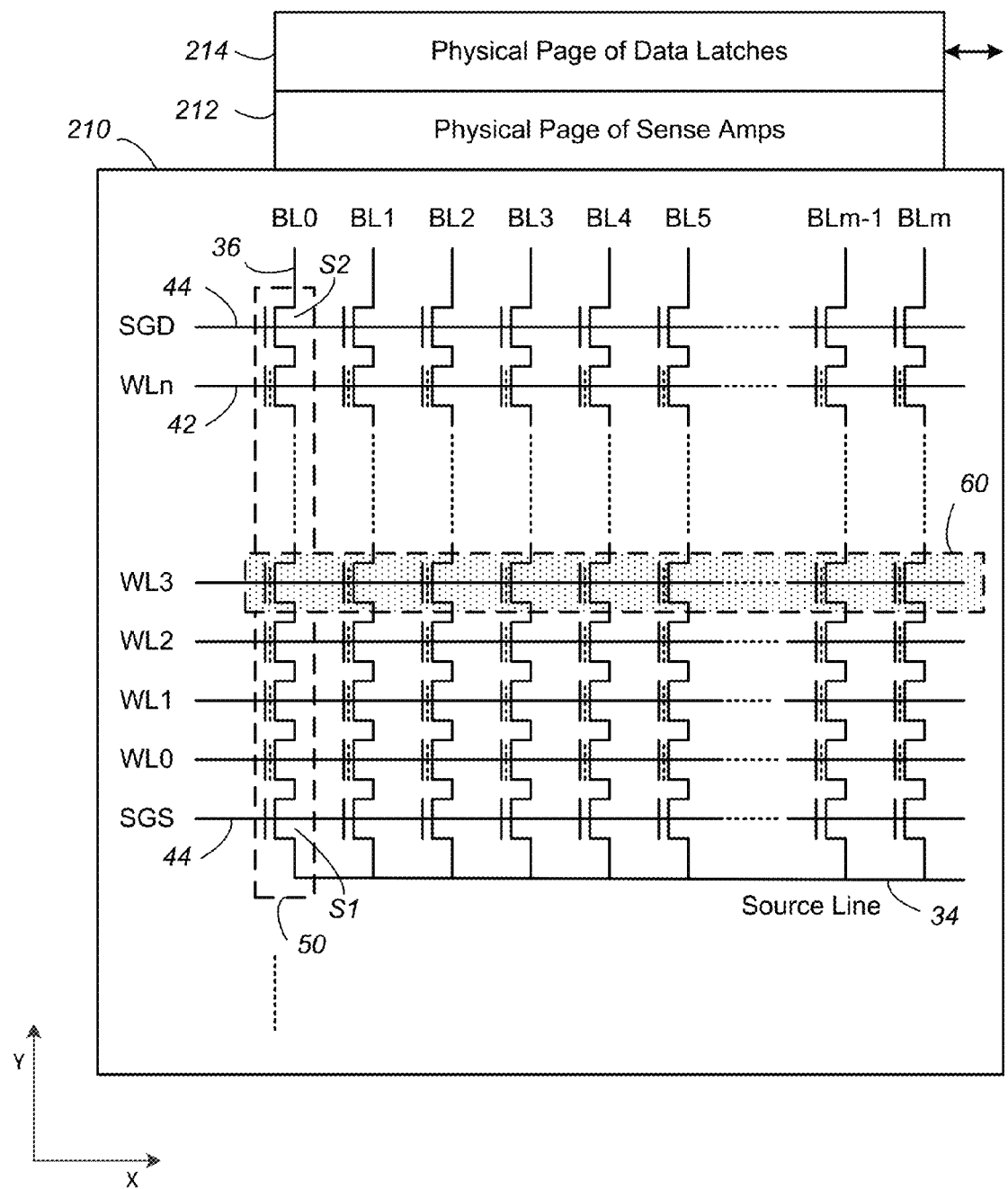
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C" that may be read using read voltages $rV_1$, $rV_2$, and $rV_3$. FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Some memory systems are based on physical phenomena other than charge storage. An example is Resistive Random Access Memory (ReRAM), which uses electrical resistance of memory elements to store data. High and low resistances may signify different logical states. A window of resistances may be divided into ranges that signify different logical states so that an individual resistive element may store more than one bit. Thus, like charge-storage memory systems, resistive memories, and memories based on other physical phenomena may be used to store one bit per cell in a Single Level Cell (SLC) configuration, or to store multiple bits per cell in a Multi Level Cell (MLC) configuration.

Figure 9:
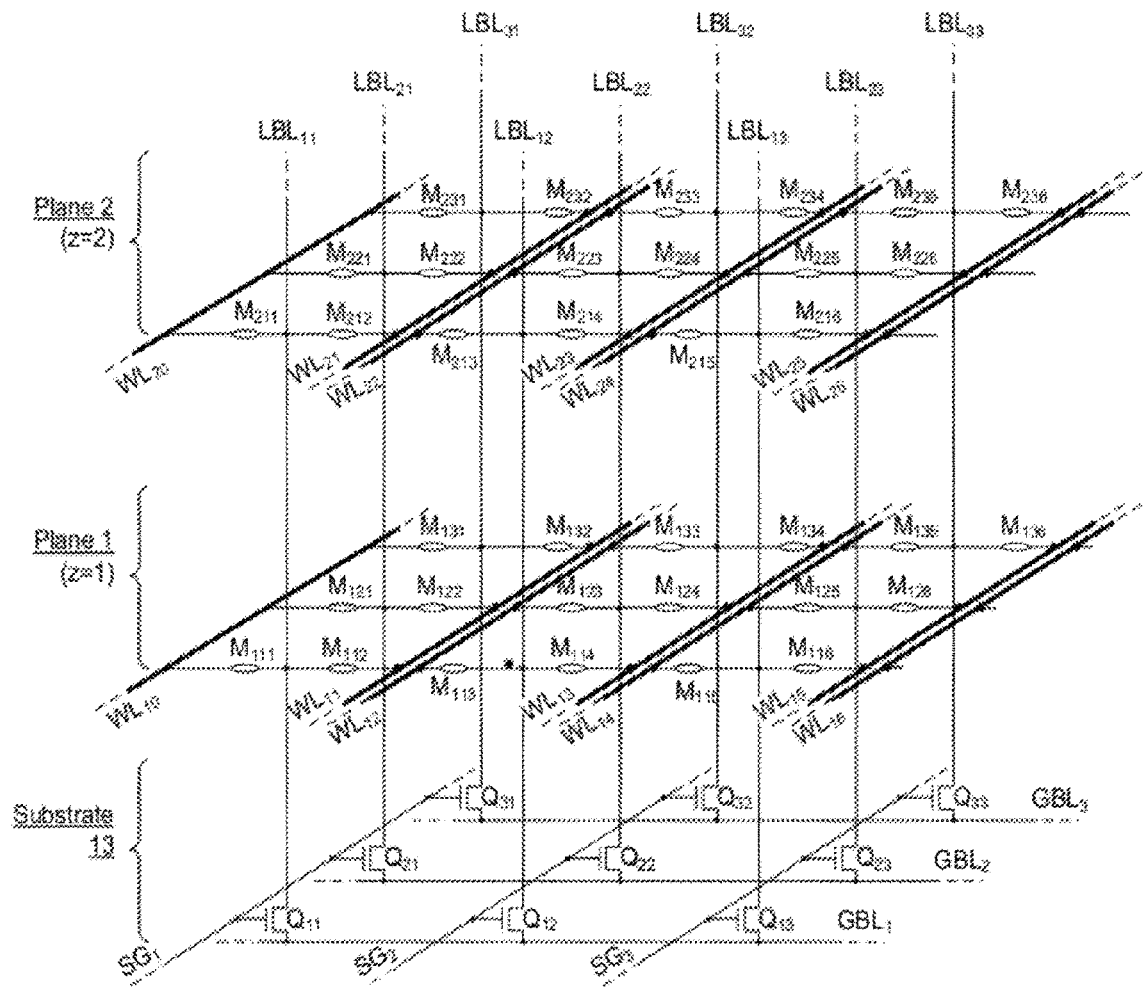
FIG. 9 shows a portion of a 3-D ReRAM memory array.

FIG. 9 shows an example of a three dimensional memory (ReRAM) in which memory elements are formed by resistive elements. Global bit lines (GBL1-GBL3) extend horizontally in the substrate with select transistors connecting global bit lines to local bit lines (LBL11-LBL33). Memory cells are formed in horizontal planes (e.g. plane 1, plane 2) that extend above the substrate. Word lines in each plane connect to resistive elements of the plane with the opposite ends of the resistive elements connected to local bit lines. Word lines extend in pairs in this example (e.g. WL11 and WL12). In other examples word lines connect to resistive elements on either side and are not paired.

While particular examples of two dimensional and three dimensional memory design are described above, techniques described here are applicable to a wide range of memories and are not limited to the examples described (i.e. not limited to charge storage, or resistive memories, or limited to SLC or MLC, or to particular hardware).

FIGS. 10A-B show an example of a programming operation that programs SLC memory cells from an erased condition. All memory cells are initially in an erased condition having threshold voltages, $V_{TH}$, corresponding to an erased condition. A subsequent series of programming and verification steps increases threshold voltages of memory cells that are to store logic state 0 while other memory cells remain in the erased threshold voltage range corresponding two logic state one. FIG. 10 B shows distributions of memory cells in logic state one and logic state zero being approximately equal so that approx. In general, large portions of data tend to have such a balanced distribution with approximately equal numbers of bits in each logic state. However, there may be significant variation on a smaller scale with some portions having more bits in a particular logic state.

FIG. 11 shows an example of threshold voltage distribution for data that contains more logic 0s than logic 1s. The result is that more memory cells are programmed to threshold voltage range corresponding to the logic 0 state.

In contrast, FIG. 12 shows an example of threshold voltage distribution for data that contains more logic 1 s than 0s. The result is that more memory cells remain in the erased condition corresponding to a logic 1 state than are programmed to the programmed logic 0 state.

Programming a page of memory cells uses some energy and requires some time. Generally, the energy used in programming increases according to the number of cells that are to have their threshold voltages increased. (In other memories, some states may require more energy and/or time to program than others.) Thus, programming a page of memory cells as shown in FIG. 11 would generally require more energy than programming the same page of memory cells as shown in FIG. 12. Furthermore, it may take longer to program the data shown in FIG. 11 because there are more likely to be slow programming cells that have to be programmed to the logic 0 threshold voltage range. In addition, programming data of FIG. 11 may cause more disturbance to previously programmed data near the memory cells being programmed because programming voltages may be applied to more cells and may be applied over more program-verify cycles. Thus, it may be preferable to have data with a distribution as illustrated in FIG. 12 rather than as shown in FIG. 11.

Figure 13A:
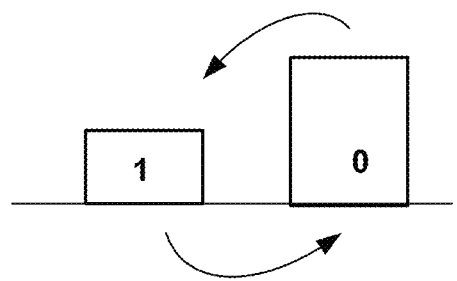
FIGS. 13A-B illustrate an example of shaping data by inverting the data.
Figure 13B:
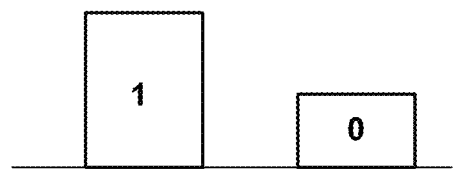

FIGS. 13A-B illustrate an example of inverting a portion of data to have a more desirable distribution or shape. FIG. 13A shows a distribution in which there are more logic 0 bits than logic 1 bits. If such data was directly programmed in SLC memory cells in which logic 0 is mapped to a programmed threshold voltage range and logic 1 is mapped to the erased threshold voltage range then it could take significant energy, time, and could cause significant disturbance. In this case, the data is inverted by flipping all bits so that logic 0s become logic 1s and logic 1s become logic 0s. This produces the distribution shown in FIG. 13B which contains more logic 1 bits than logic 0 bits. If this data is now programmed in SLC memory cells in which logic 0 is mapped to a programmed threshold voltage range and logic 1 is mapped to the erased threshold voltage range then it will may require less energy, take less time, and may cause less disturbance than the uninverted data of FIG. 13A. When data is inverted, some record is generally maintained to indicate that the data is inverted so that the data is later decoded correctly (e.g. by inverting the data back to its original condition after reading it). It will be understood that inverting the mapping of logic states to threshold voltage ranges may be considered an example of inverting also, e.g. changing the mapping so that logic 0 corresponds to the erased state and logic 1 corresponds to the programmed state.

Inverting data is one example of how data may be modified prior to storage in order to improve some aspect of data storage (e.g. improve programming, data retention, reading, or some other characteristic). Other operations may also be applied in order to modify the distribution of logic states and thereby modify the distribution of threshold voltages (or distribution of electrical resistances, or other characteristic) to which memory cells are programmed. Such operations, which modify the overall profile or shape of the data may be referred to as "shaping" operations and data that is modified in this way may be referred to as "shaped data."

Figure 14A:
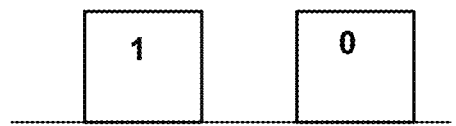
FIGS. 14A-B illustrate an example of shaping balanced data.
Figure 14B:
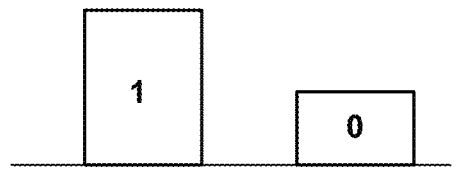

FIGS. 14A-B show another example of a shaping operation. FIG. 14A shows unshaped data that has approximately the same number of logic 1 bits and logic 0 bits. Thus, inverting such data would not substantially modify the shape of the data. Accordingly, some other transformation may be applied in order to modify the number of logic 1 and logic 0 bits.

FIG. 14B shows the data of FIG. 14A after shaping to produce more logic 1 bits (and correspondingly fewer logic 0 bits). An appropriate transformation may apply an encoding scheme that provides a higher number of logic 1 s. Such an encoding scheme may be independent of other encoding schemes or may be combined with another encoding scheme, e.g. with an Error Correction Code (ECC) encoding scheme.

Figure 15A:
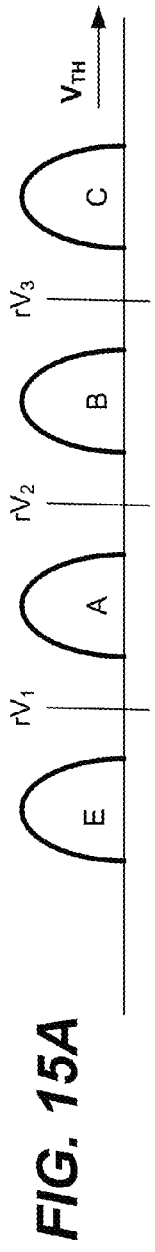
FIGS. 15A-C illustrate shaping of MLC data.
Figure 15B:
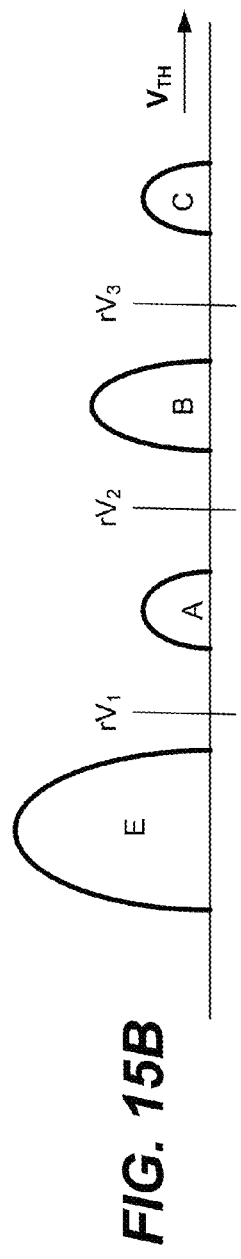
Figure 15C:
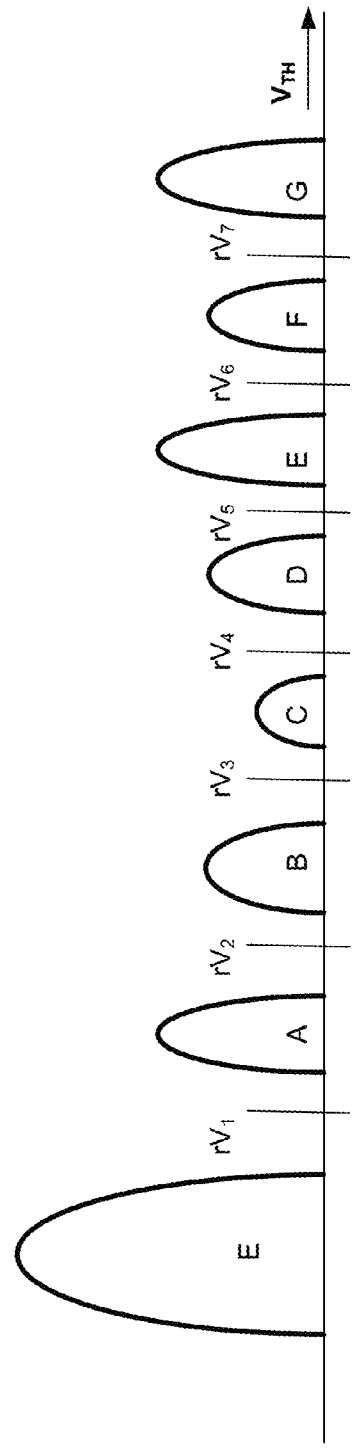

FIGS. 15A-C show other examples of shaping operations, in these cases shaping operations applied to MLC data. While FIG. 15A shows memory cells storing data in four different logic states E, A, B, C with equal numbers of memory cells in each logic state, such a shape may not be desirable.

FIG. 15B shows an example of shaped data stored in the same MLC memory so that data is weighted towards the logic states that correspond to lower threshold voltages, i.e. weighted towards the E state. In general, the time and energy consumed, and the disturbance caused increases with increasing threshold voltage range so that programming a memory cell to the A state may be more desirable than programming it to the B or C states. And programming to the B state may be more desirable than programming to the C state. Accordingly, data that is shaped as shown in FIG. 15B may be more desirable than unshaped data as shown in FIG. 15A. While this example shows four states (storing two bits per memory cell) it will be understood that shaping may be applied to other MLC examples that store more than two bits per cell (e.g. three bits, four bits, or more). FIG. 15C shows an example of shaped data storing three bits per cell (TLC). With the distribution of states weighted towards lower threshold voltage states (e.g. E and A states). Similar shaping may be used to modify distributions of electrical resistance in ReRAM or distributions of some other characteristic in other memories.

In some memory systems, portions of the memory array are monitored or tested during operation in order to characterize the performance and make adjustments accordingly if needed. Such monitoring may be performed on a block-by-block basis, or on some other unit of memory cells. For example, a block may be monitored at intervals based on the number of write-erase cycles experienced by the block. A cycle in which such monitoring is performed may be referred to as a "polling" cycle. Various metrics may be used during such characterization. For example the time required for programming, or the number of programming pulses (program loop count) required may be used for characterization. Other metrics may include metrics related to reading data such as the time required to read memory cells, or the number of bad bits in data read from the memory (e.g. BER found by ECC). A high resolution read may be used to give detailed data regarding threshold voltage distribution that may indicate soft errors as well as hard errors. Other metrics may include erase related metrics such as the time, or number of erase pulses, required to erase a block. In some memories, memory operation is adjusted according to results of characterization during polling cycles. Appropriate adjustment may not occur where adjustment is based on characterization that does not accurately reflect memory condition.

Where data is shaped such characterization may not reflect the true condition of the portion of memory being monitored. In particular, characterization that is based on shaped data may indicate that a portion of memory is in a better condition than it really is and thus may hide problems that should be addressed. For example, where a large number of memory cells remain in the erased condition (logic state 1, or E state in examples above), this may provide data that indicates faster programming, reading, and erasing than would be observed with balanced data (data with equal numbers of bits in each logic state). Using shaped data for characterization may also result in inconsistent results because shaping may affect different data differently. While some data may be nearly balanced after shaping (i.e. close to 50% in each logic state for SLC) other data may be more affected by shaping (e.g. 90% logic 1) so that very different characterization might be observed for the same memory cells (e.g. same block) depending on the shaping of the data.

Figure 16:
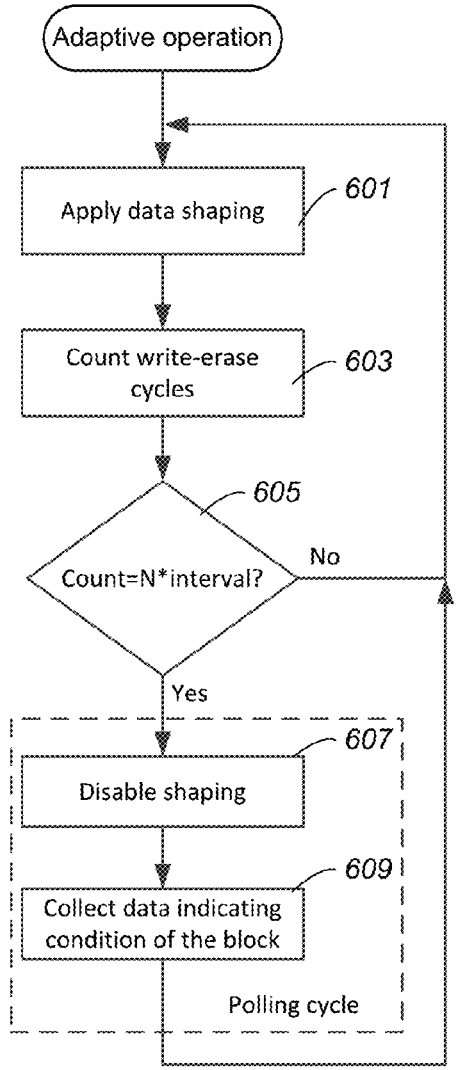
FIG. 16 illustrates an example of adaptive operation of a block.

FIG. 16 shows an example of an adaptive shaping scheme in which data is shaped during non-polling cycles so that the benefits of shaping may be obtained during regular operation, with shaping disabled during a polling cycle so that accurate characterization data may be obtained.

Initially, data shaping is applied 601 to data that is being stored in a block. For example, portions of data may be inverted if they have more than a threshold number of bits with a particular logic state corresponding to a high threshold voltage range. A count is maintained 603 of the number of write-erase cycles (hot count) for the block and for every other block. For example, a memory controller may maintain hot counts for all blocks in a memory array. The write-erase cycle count for the block is used to trigger a polling cycle in this example. A polling cycle is performed at regular intervals in this example so that every time the count is an integer (N) times the interval 605 then a polling cycle is triggered. For example, if the interval is a thousand cycles then a polling cycle is triggered at one thousand cycles, at two thousand cycles, at three thousand cycles, and so on.

When a polling cycle is triggered, shaping is temporarily disabled 607 so that data is substantially balanced. In other examples, where raw data may not be balanced, some operation may be performed to bring data to a balanced condition, i.e. data may be randomized or scrambled to achieve a balance of logic states. The polling cycle is completed using data that is substantially balanced and data is collected 609 that indicates the condition of the block (e.g. data may be collected during programming, reading, and/or erasing and one or more metrics may be obtained from this data). At the end of the polling cycle, operation returns to the default condition with data shaping applied 601 until the next polling cycle.

Figure 17:
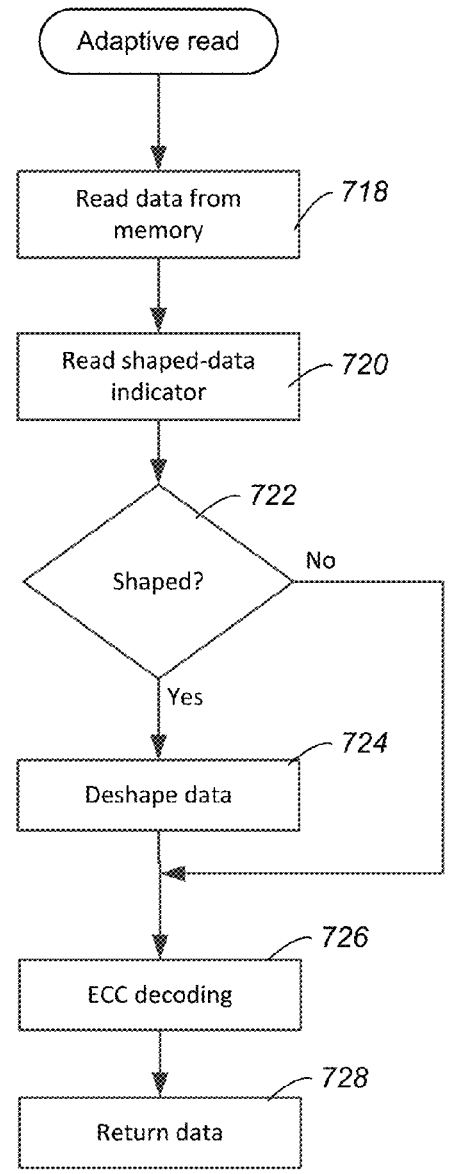
FIG. 17 illustrates an example of adaptive reading.

Because some data is shaped before writing and some is written as unshaped (raw) data (or randomized data) there may be some differences in how different portions of data are handled during read operations. FIG. 17 shows an example of an adaptive read operation. Data is read 718 from memory cells and a shaped-data indicator is read 720. A shaped-data indicator may be one or more bits that indicate whether the data is shaped. This bit or bits may be stored as header data or in some other format. A determination is made 722 based on the shaped-data indicator as to whether the data is shaped. If the data is shaped then a deshaping operation is performed to deshape the data 724 (e.g. by inverting or otherwise transforming it back to its raw condition). If the data is not shaped then no deshaping may be performed. Subsequently, data is decoded 726 by ECC decoding and the decoded (corrected) data is returned 728 (e.g. to a host).

Figure 18:
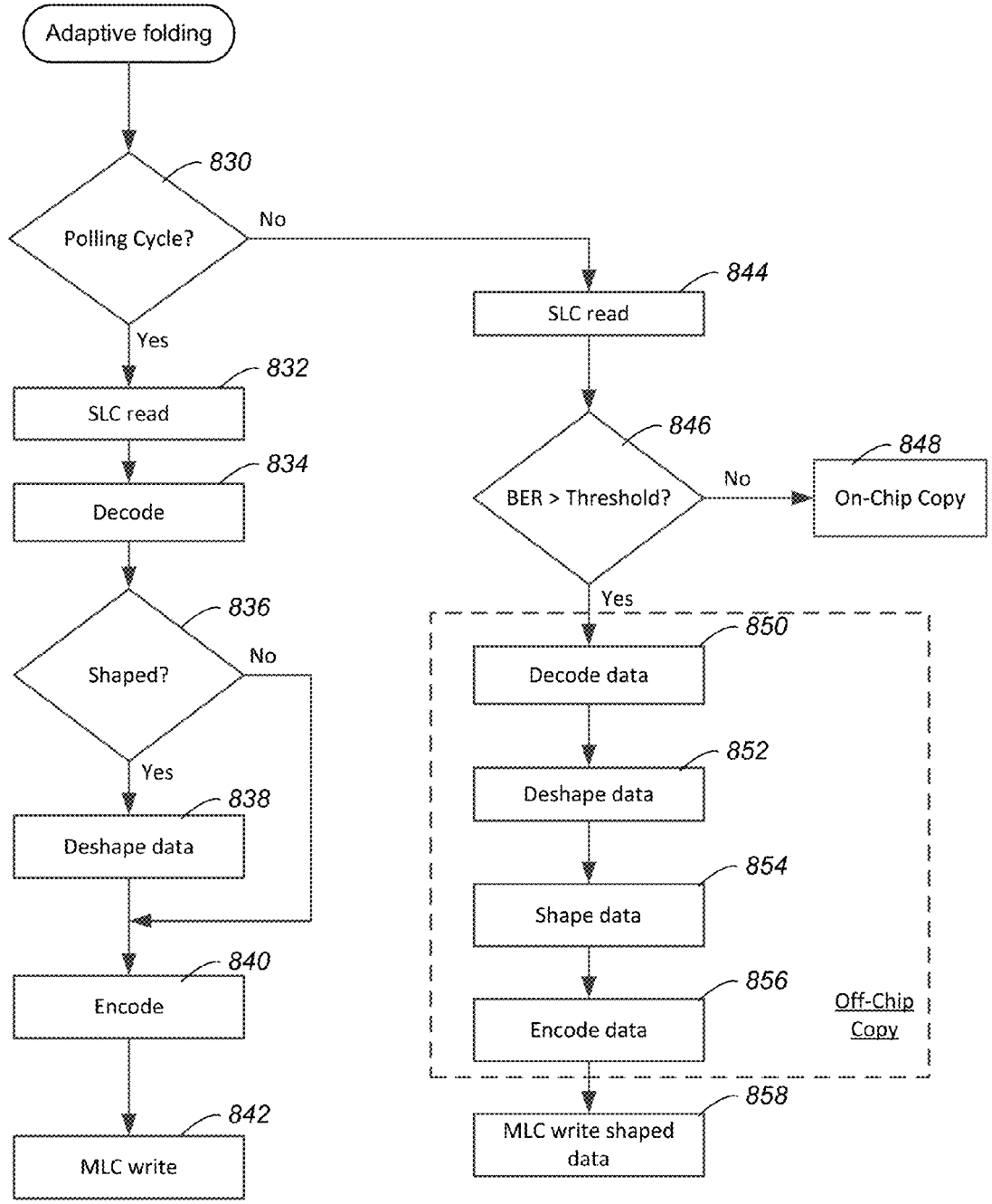
FIG. 18 illustrates an example of adaptive folding.

In addition to allowing collection of more accurate data during a polling cycle, adaptive shaping of data may be used in various other applications. For example, FIG. 18 shows an example of adaptive folding in which adaptive shaping is used during a folding operation. In some memory systems, data is initially written in SLC format in order to rapidly store data and is then copied to another location where the data is written in MLC format for high density storage. Thus, two or more pages of SLC data may be folded into an MLC page. Such folding operations may be more complex when adaptive shaping is applied.

In FIG. 18, when a folding operation is to be performed, a determination is made 830 as to whether the present cycle is a polling cycle for the destination block, i.e. the block where MLC data is to be written. If it is a polling cycle then SLC data is read 832, e.g. from two or more SLC source blocks and the data is decoded 834, e.g. by ECC decoding. A determination is then made 836 as to whether the data is shaped or not. If the data is shaped then it is deshaped 836. If the data is not shaped then no deshaping is needed (data may be descrambled or otherwise processed if needed). Subsequently, the data is encoded 840, e.g. by ECC encoding. The encoded data is then written 842 in MLC format in a destination block. Thus, even though the source data was shaped SLC data, the data is stored as deshaped or balanced data in the MLC block because it is a polling cycle.

If the present cycle is not a polling cycle 830 then an SLC read is performed 844. The Bit Error Rate (BER) of the data read from SLC is then compared with a threshold 846. If the BER does not exceed the threshold (i.e. if the data has a relatively low error rate) then on-chip copy is used 848 to copy SLC data from one or more SLC blocks to an MLC block on the same die using on-chip data latches. In general, the source blocks (SLC blocks) and the destination block (MLC block) are in the same plane and thus share a common set of data latches. Such on-chip copying may be considered the default copying operation that is used for good data during non-polling cycles. If the BER exceeds the threshold 846 then on-chip copying may not be used. Instead, the data is decoded 850 and the data is deshaped 852, which may be done off-chip. For example, in a memory controller in what may be referred to as a "copy through controller" or CTC operation. In some cases the order of decoding and deshaping may be reversed or these two operations may be combined, e.g. an encoding/decoding scheme may be implemented that also shapes/deshapes data. Thus, corrected data is obtained and the high BER of the SLC data that was read is reduced to an acceptable level. This corrected data is then shaped 854 and encoded 856. The shaped data is then written 856 in MLC format. Thus, rather than folding SLC data with a high BER which could compound errors in the MLC copy, when SLC data has high error rates the data is corrected off-chip and the corrected data is shaped and stored in MLC format.

Figure 19:
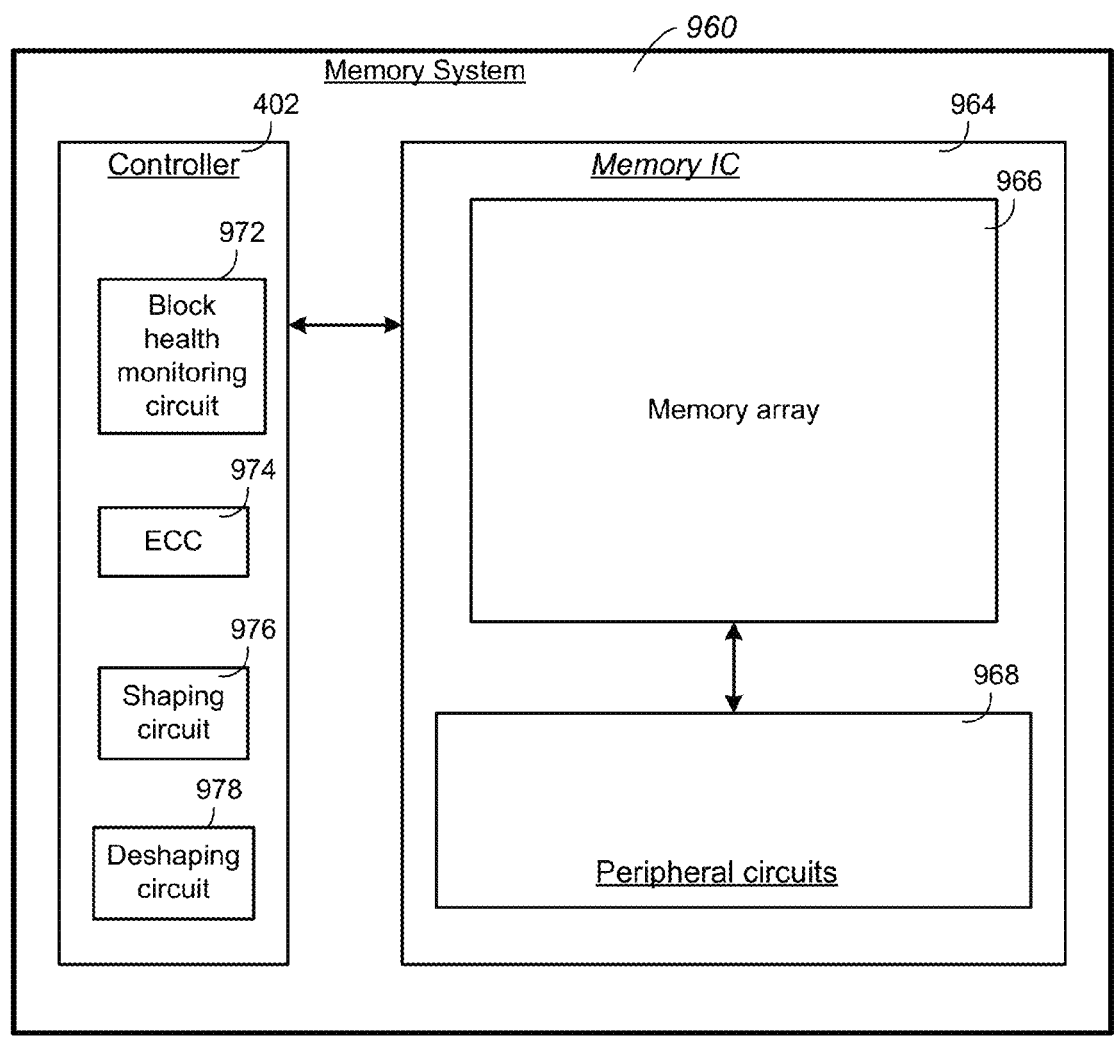
FIG. 19 shows an example of memory system components.

FIG. 19 shows an example of components that may be used to implement aspects of the techniques described above. Memory system 960 includes a memory controller 962 and a memory Integrated Circuit (IC) 964. Memory IC 964 includes a memory array 966 which may include multiple blocks and may include both MLC blocks and SLC blocks arranged in planes with common data latches. Memory IC 964 also includes peripheral circuits 968. Memory controller 962 includes block health monitoring circuit 972 which collects data regarding block health for each block during the block's polling cycles. ECC circuits 974 perform encoding of data prior to storage and decoding of data after reading so that errors may be detected and corrected. Shaping circuits 976 selectively shape data as required by an adaptive data shaping scheme prior to storage of the data. Data deshaping circuits 978 selectively deshape previously shaped data after the data is read from the memory array. Components, including the components shown in FIG. 19, may be formed as dedicated circuits, e.g. in an ASIC. Components may also be formed using some form of programmable logic (e.g. Field Programmable Gate Array, FPGA, or other programmable hardware). Components may be formed by configuring circuits through firmware or other configuration so that, for example, a general purpose circuit may be adapted for a specific purpose through appropriate software.

CONCLUSION

The foregoing detailed description has been presented for purposes of illustration and description. It is not intended to be exhaustive or to limit the attached claims. Many modifications and variations are possible in light of the above teaching.

It is claimed:

1. A method comprising:
   maintaining a write-erase cycle count for a block in a nonvolatile memory;
   performing a plurality of write-erase cycles on the block, data written during the plurality of write-erase cycles subject to a shaping operation prior to storage;
   in response to the write-erase cycle count satisfying a predetermined threshold, initiating a polling cycle;
   during the polling cycle:
      disabling the shaping operation so that user data is stored without being subject to the shaping operation;
      collecting data that indicates a condition of the block based on an operation using the unshaped user data; and
   reenabling the shaping operation for one or more subsequent write-erase cycles.

2. The method of claim 1 further comprising storing a shaped-data indicator with any portion of data that was subject to the shaping operation prior to storage.

3. The method of claim 1 wherein the shaping operation includes inverting portions of data.

4. The method of claim 3 wherein the shaping operation includes dividing user data into portions of data of a uniform size and inverting any portion of data containing more than a threshold number of bits of a first logic state.

5. The method of claim 1 wherein the predetermined threshold is satisfied based on the write-erase cycle count being an integer multiple of a predetermined interval, and wherein a polling cycle is initiated, including disabling the shaping operation and collecting data that indicates the condition of the block, whenever the write-erase cycle count is any integer multiple of the predetermined interval.

6. The method of claim 1 wherein the data that indicates the condition of the block includes data regarding conditions used to perform a write operation on the block.

7. The method of claim 6 wherein the data regarding conditions used to perform the write operation includes at least one of: a number of programming pulses applied, a time required for programming, a programming voltage.

8. The method of claim 1 wherein the data that indicates the condition of the block includes data obtained from a read operation performed during the polling cycle.

9. The method of claim 8 wherein the data from the read operation includes a number of bad bits in data read from the block.

10. The method of claim 1 wherein the data that indicates the condition of the block includes data regarding erase conditions applied to erase the block.

11. The method of claim 1 further comprising:
    between polling cycles, performing data folding operations that use the block as a destination block by reading portions of data from Single Level Cell (SLC) blocks to an on-chip location that is on a chip on which the SLC blocks are located and storing the portions of data in the block without transferring the portions of data off the chip; and
    during the polling cycle, performing data folding operations that use the block as a destination block by transferring portions of data from SLC blocks to an off-chip location that is not on the chip, reversing any shaping operations that were performed on the portions of data prior to storage in the SLC blocks, and storing resulting unshaped data in the block.

12. The method of claim 11 further comprising:
    between polling cycles, identifying error rates in the portions of data read from SLC blocks; and
    if an error rate exceeds a maximum value then transferring corresponding portions of data read from the SLC blocks to the off-chip location that is not on the chip, reversing any shaping operations that were performed on the portions of data prior to storage in the SLC blocks, correcting errors in the portions of data read from the SLC blocks, and storing resulting corrected unshaped data in the block.

13. The method of claim 12 further comprising, during the polling cycle, performing Error Correction Code (ECC) correction of the portions of data prior to storage in the block.

14. The method of claim 12 wherein the SLC blocks and the block are formed in a common plane and wherein the on-chip location includes data latches of the common plane.

15. The method of claim 14 wherein the off-chip location is on a memory controller chip.

16. A method comprising:
performing a plurality of write-erase cycles on a plurality of blocks, write erase cycles including two types of cycle, a polling cycle and a non-polling cycle;
in a non-polling cycle, performing data shaping on data prior to storage in the nonvolatile memory, the data shaping reducing a first number of bits of a first logic state that is mapped to a high threshold voltage range and increasing a second number of bits of a second logic state that is mapped to a low threshold voltage range;
in a polling cycle, storing user data in the nonvolatile memory without the data shaping; and
in the polling cycle, collecting data related to at least one of: programming, reading, and/or erasing the unshaped user data.

17. The method of claim 16 further comprising maintaining individual write-erase cycle counts for the plurality of blocks.

18. The method of claim 17 wherein a polling cycle is initiated in response to a write-erase cycle count for an individual block being equal to an integer multiple of a polling interval and wherein whenever the write-erase cycle count for the individual block is not equal to an integer multiple of the polling interval a non-polling cycle is initiated.

19. The method of claim 16 wherein the data collected in the polling cycle is used to select a set of parameters that is subsequently used for accessing the block during a plurality of non-polling cycles.

20. A nonvolatile memory system comprising:
a plurality of independently erasable blocks;
a data shaping circuit that is configured to transform user data received from a host and send the transformed user data for storage during a non-polling write-erase cycle, the data shaping circuit configured to send untransformed user data for storage during a polling write-erase cycle; and
a block health monitoring circuit that generates a block health indicator for each of the plurality of blocks, the indicator being updated based on data obtained for an operation using the untransformed user data during a polling write-erase cycle.

21. The nonvolatile memory system of claim 20 further comprising on-chip data latches that store data during on-chip folding of data from Single Level Cell (SLC) to Multi Level Cell (MLC) blocks during a non-polling write-erase cycle and off-chip storage that stores data off-chip during folding of data from SLC to MLC blocks during a polling write-erase cycle.

22. The nonvolatile memory system of claim 21 further comprising a data deshaping circuit that is configured to deshape shaped data stored in SLC blocks prior to folding during a polling write-erase cycle.

* * * * *